US012615024B2

(12) United States Patent
Chance et al.

(10) Patent No.: US 12,615,024 B2
(45) Date of Patent: Apr. 28, 2026

(54) METHOD AND APPARATUS FOR AUTOMATIC GAIN CONTROL

(71) Applicant: Intel Corporation, Santa Clara, CA (US)

(72) Inventors: Gregory Chance, Chandler, AZ (US); Peter Pawliuk, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 791 days.

(21) Appl. No.: 17/809,908

(22) Filed: Jun. 30, 2022

(65) Prior Publication Data

US 2024/0007070 A1      Jan. 4, 2024

(51) Int. Cl.
   *H03G 3/30*      (2006.01)
   *H03M 1/18*      (2006.01)
   *H04B 1/40*      (2015.01)

(52) U.S. Cl.
   CPC ......... *H03G 3/3068* (2013.01); *H03G 3/3089* (2013.01); *H03M 1/18* (2013.01); *H04B 1/40* (2013.01)

(58) Field of Classification Search
   CPC .... H04B 1/38; H04B 1/40; H03F 3/19; H03F 3/245; H03F 2200/294; H03G 3/001; H03G 3/3068; H03G 3/3089; H03M 1/18; H03M 1/185

USPC ........ 375/219, 220, 222, 345, 350; 370/278; 455/83, 226.1, 234.1, 245.1, 250.1
See application file for complete search history.

(56) References Cited

U.S. PATENT DOCUMENTS

| | | | |
|---|---|---|---|
| 7,593,484 B2 * | 9/2009 | Beamish ............. | H04L 27/3809 330/252 |
| 2005/0174274 A1 * | 8/2005 | Delanghe .............. | H03M 1/183 341/139 |
| 2006/0222118 A1 * | 10/2006 | Murthy ............... | H04L 27/2647 375/345 |
| 2022/0209806 A1 * | 6/2022 | Hsu ...................... | H04B 1/1027 |

* cited by examiner

*Primary Examiner* — Young T. Tse
(74) *Attorney, Agent, or Firm* — 2SPL Patent Attorneys PartG mbB; Yong Beom Hwang

(57)                ABSTRACT

A method and apparatus for automatic gain control (AGC). A transceiver includes an analog-to-digital converter (ADC) configured to convert a received analog signal to digital signal, a measurement circuitry configured to measure a signal level on the digital signal, an AGC controller configured to generate, based on the measured signal level, an analog gain control signal to change a gain to be applied to a received analog signal in analog domain and a digital gain control signal for digital gain compensation corresponding to the gain change in analog domain, and a digital gain compensation circuitry configured to apply the digital gain compensation based on the digital gain control signal. The digital compensation gain applied to the digital bits follows a ramp profile that is an inverse of a transient response to the gain change in analog domain.

19 Claims, 11 Drawing Sheets

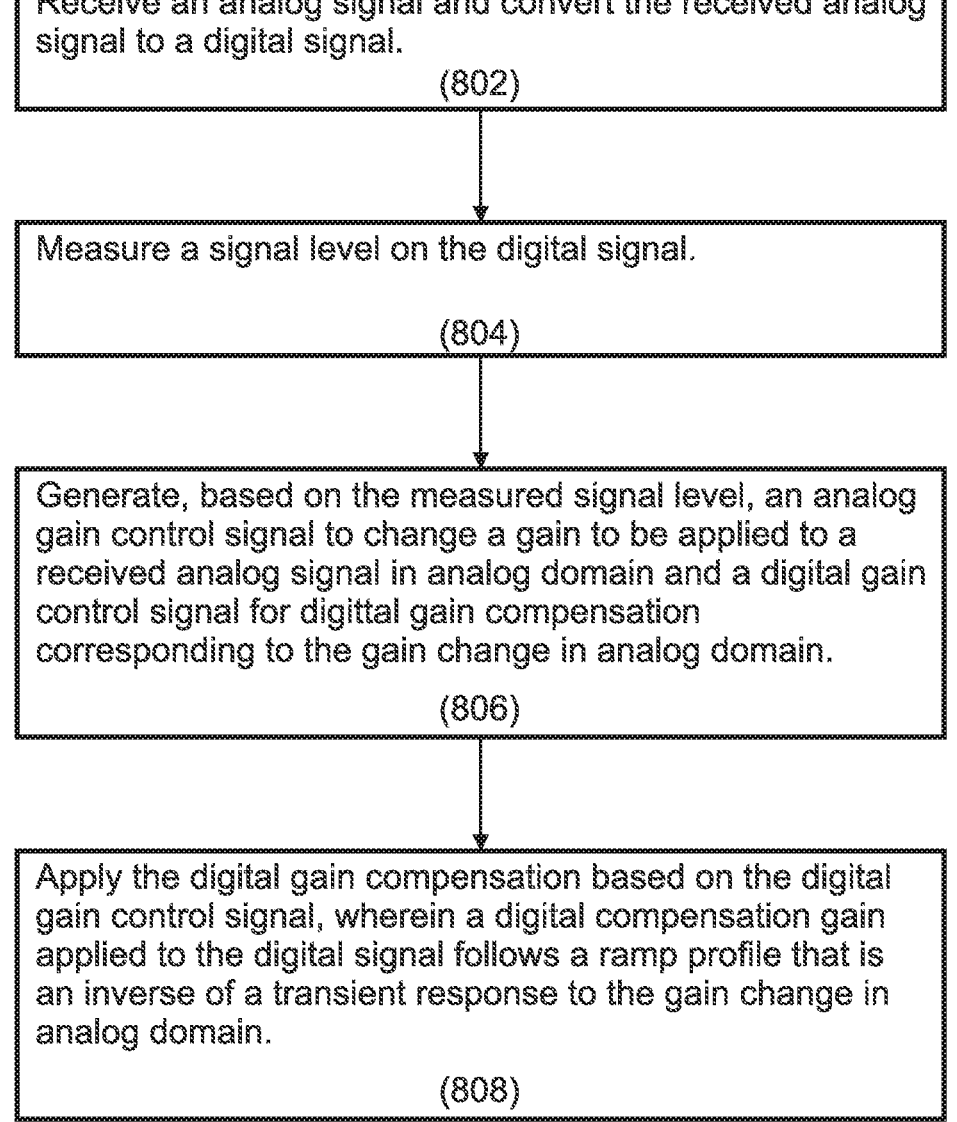

Receive an analog signal and convert the received analog signal to a digital signal.

(802)

Measure a signal level on the digital signal.

(804)

Generate, based on the measured signal level, an analog gain control signal to change a gain to be applied to a received analog signal in analog domain and a digital gain control signal for digittal gain compensation corresponding to the gain change in analog domain.

(806)

Apply the digital gain compensation based on the digital gain control signal, wherein a digital compensation gain applied to the digital signal follows a ramp profile that is an inverse of a transient response to the gain change in analog domain.

METHOD AND APPARATUS FOR AUTOMATIC GAIN CONTROL

BACKGROUND

Automatic gain control (AGC) is implemented in an amplifier or a chain of amplifiers to maintain a suitable signal amplitude at its output using closed-loop feedback. The average or peak output signal level of the amplifier is used to dynamically adjust the gain of the amplifier. This can enable the amplifiers to work satisfactorily with a greater range of input signal levels.

The receiver (Rx) AGC may work on a fast-attack basis, which means that the Rx gain state will change immediately when a blocker is detected. The attack time refers to an AGC circuit's response to an increase in input amplitude. When the AGC switches the gain of an amplifier or attenuator (e.g., in response to detection of a blocker), this can cause a transient effect. The transient effects associated with switching the gain state of an AGC could degrade the demodulation quality of the symbol that is being received at that time. If the AGC needs to make several gain steps in succession, this could cause a significant disturbance in the reception.

To avoid the problem associated with the transient effects of the gain switch, the gain changes may be delayed so that the transient effects only occur within a cyclic prefix of a symbol. However, if a blocker comes on quickly it can cause saturation in the receive chain, which is much more detrimental to performance. The delay often cannot be allowed. Alternatively, the analog circuits may be altered to minimize the transient time. However, the gain steps are often implemented in the front-end components, and they cannot be redesigned for this purpose. Even if the gain block has very fast transitions between gain states, other circuitries, including the digital filters, can contribute to a detrimental transient response.

BRIEF DESCRIPTION OF THE FIGURES

Some examples of apparatuses and/or methods will be described in the following by way of example only, and with reference to the accompanying figures, in which

FIG. 8 is a flow diagram of an example method for automatic gain control;

DETAILED DESCRIPTION

Figure 1:
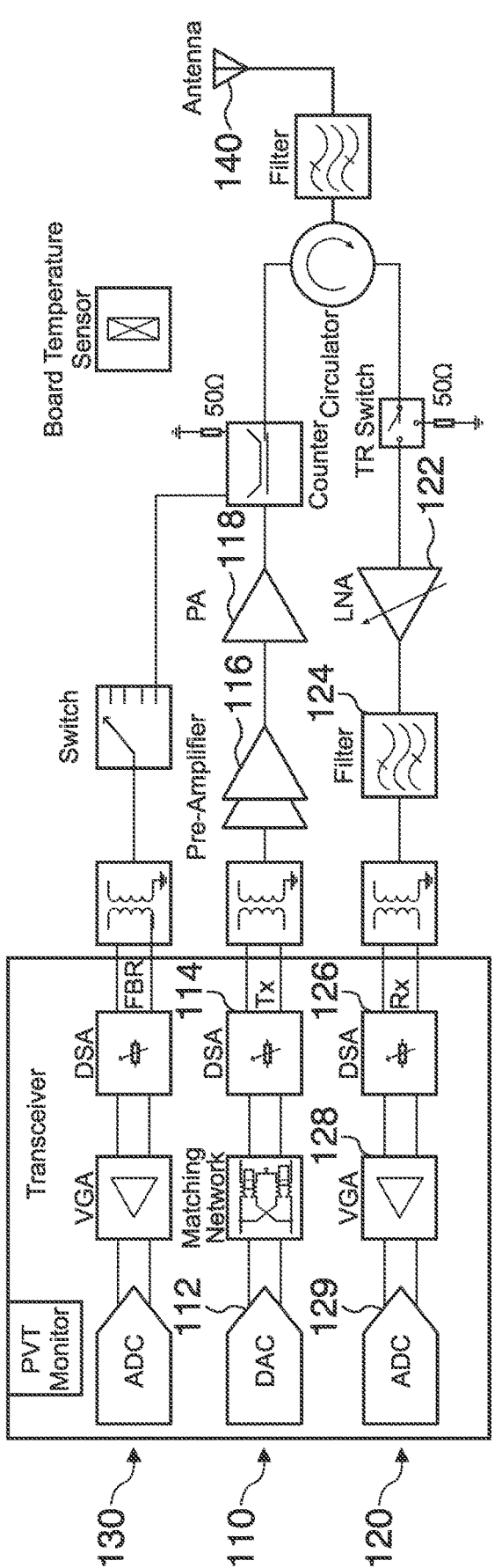
FIG. 1 shows an example transceiver with an analog front-end.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

When a blocker signal (e.g., an interfering signal) appears at the receiver (e.g., at the receiver of a cellular base station), the analog gain needs to be lowered to prevent signal saturation. In a receiver, a strong blocker/interfering signal may be present at the antenna input outside the bandwidth of the desired signal. The blocker signal may cause a substantial interference. The AGC algorithm is used to monitor for blockers/interferers and decide how and when to apply gain changes.

FIG. 1 shows an example transceiver 100 with an analog front-end. The transceiver 100 may be a cellular base station transceiver. The transceiver 100 includes a transmit chain 110, a receive chain 120, and a feedback chain 130. A transmit signal is converted to an analog signal by a digital-to-analog converter (DAC) 112 and may go through a digital step attenuator (DSA) 114 for gain control, and then may be amplified by a pre-amplifier 114 and a power amplifier (PA) 116 and then transmitted via an antenna 140. The received analog signal via the antenna 140 may be amplified by a low noise amplifier (LNA) 122, and then processed by a filter 124, a DSA 126, and a variable gain amplifier (VGA), and then converted to digital by an analog-to-digital converter (ADC) 128. The transmit signal may be coupled to the feedback chain 130 for feedback processing.

The gain of the received analog signal can be adjusted in the receive chain 120 at the LNA 122 or at the DSA 126. A DSA is a device used for automatic gain control in a front-end or in a transceiver chip. A DSA, unlike variable attenuators, switches in discrete and finite attenuation states. This attenuation/gain state switching may be performed, for example, in linear or binary steps, or continuously. Whenever the analog gain is changed (either at the LNA 122 or at the DSA 126), an equivalent compensating gain should be added in the digital part of the transceiver to maintain the wanted signal level and phase.

Figure 2:
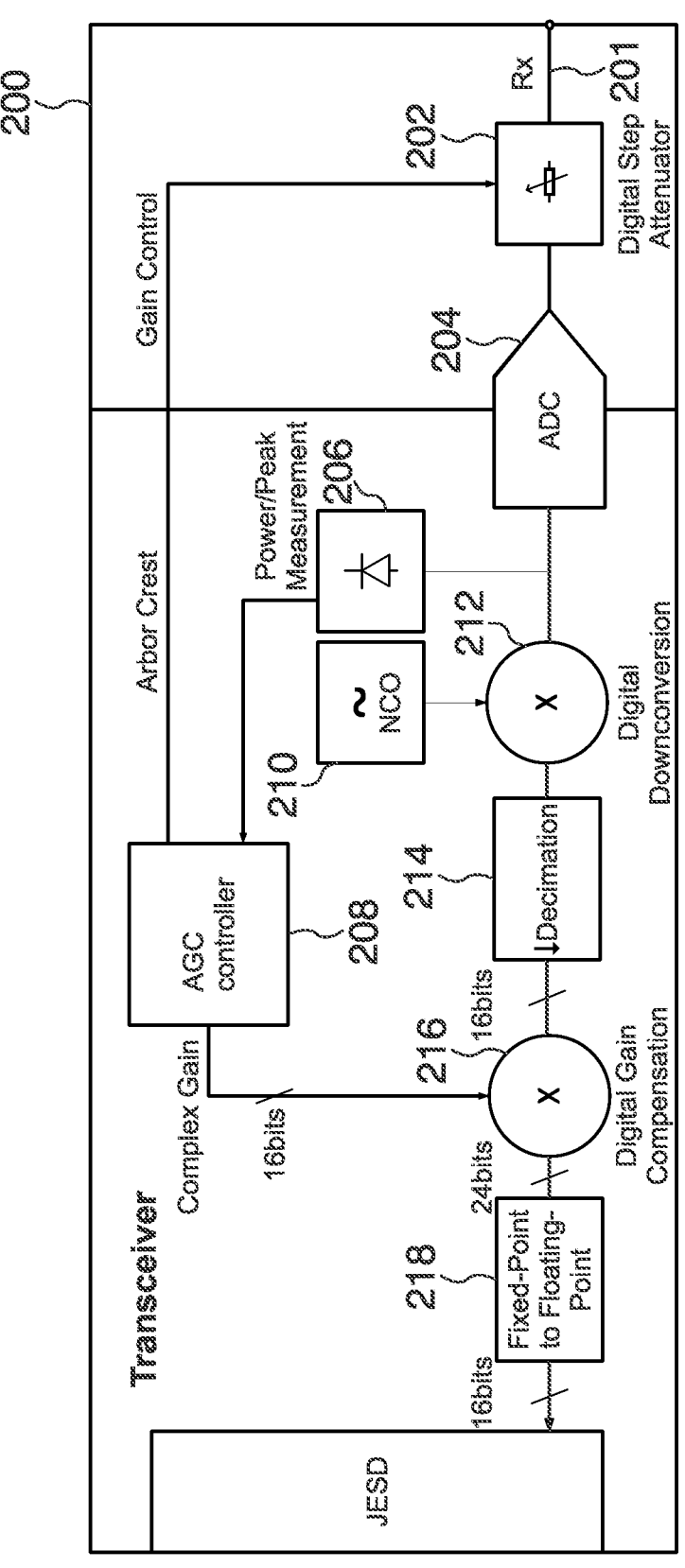
FIG. 2 is a schematic block diagram of an example transceiver including AGC and digital gain compensation.

FIG. 2 is a schematic block diagram of an example transceiver including AGC with digital gain compensation. Only a portion of the receive chain is shown in FIG. 2 for simplicity. The received signal (analog signal) 201 may be attenuated by a DSA 202, an LNA (not shown), or the like. It should be noted that a DSA and an LNA are just an example of a circuit element with gain control that could be part of an AGC system. After the DSA 202, the ADC 204 may convert the received analog signal to a digital signal (a digitized version of the received signal). A measurement unit 206 may measure a signal level (e.g., an average or peak power/amplitude) on the digital signal in digital domain and sends information regarding the measured signal level to the AGC controller 208. The AGC controller 208 determines whether to adjust the gain for the received analog signal based on the signal level measurement and may send an analog gain control signal 209 to the DSA 202 or to the LNA (not shown in FIG. 2) to change the gain for the received analog signal. The gain state at the DSA 202 (or LNA) may then be switched based on the analog gain control signal. The digital signal may be down-converted to baseband by a digital down-converter 212 with the local oscillator signal from the numerically controlled oscillator (NCO) 210. After down-conversion, decimation (down-sampling) may be performed by the decimation circuitry 214. Digital gain compensation may then be performed by the digital gain compensation block 216 (a digital gain multiplier) by multiplying a complex gain to the digital signal. After digital gain compensation, fixed point-to-floating point conversion may be performed by a converter 218. The AGC controller 208 provides the complex gain for the digital gain compensation to the digital gain compensation block 216. The AGC controller 208 also ensures that the timing of the analog gain change and the digital gain compensation align in time.

In the above scheme, the transient response of an analog gain change in the DSA or LNA may not be smooth, and digital filters in the receive chain may shape the transition (i.e., may incur distortion in the received signal). This can lead to some transient distortion that remains after the digital gain compensation.

Examples are disclosed for a scheme that can mitigate the transition distortion due to the gain switching in the analog domain. In examples, the transient distortion due to the gain switching in the analog domain may be mitigated by having the digital gain compensation follow a ramp profile rather than an instantaneous jump from one state to another. An appropriate ramp profile is calculated to ensure that the transient distortion due to the gain switching in the analog domain can be mitigated.

Figure 3:
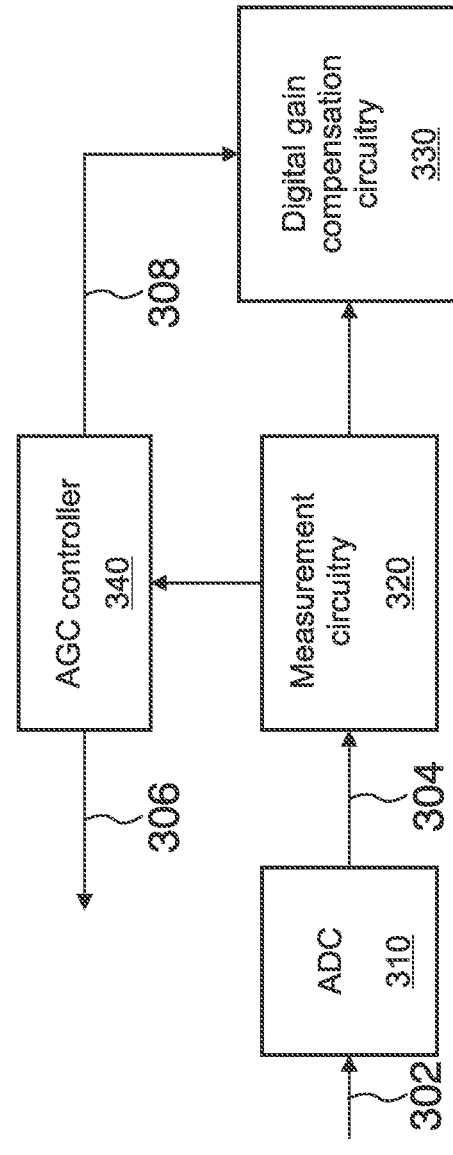
FIG. 3 is a schematic block diagram of an example transceiver.

FIG. 3 is a schematic block diagram of an example transceiver. The transceiver 300 includes an ADC 310, a measurement circuitry 320, a digital gain compensation circuitry 330, and an AGC controller 340. The ADC 310 is configured to convert a received analog signal 302 to a digital signal (digital binary bits). The measurement circuitry 320 is configured to measure a signal level (e.g., an average or peak power/amplitude) on the digital signal. The AGC controller 340 is configured to generate, based on the measured signal level, an analog gain control signal 306 to change a gain to be applied to a received analog signal in analog domain and a digital gain control signal 308 for digital gain compensation corresponding to the gain change in the analog domain. The digital gain compensation circuitry 330 is configured to apply the digital gain compensation to the digital signal based on the digital gain control signal. The digital compensation gain applied to the digital bits follows a ramp profile. In examples, instead of applying an instantaneous gain change, gradual gain changes that follow a ramp up/down function (ramp profile) may be applied to the digital signal. The ramp function may be an inverse of a transient response to the gain change in analog domain.

In one example, the digital gain compensation circuitry 330 may include a ramp circuitry configured to output a series of gain values following the ramp profile based on the digital gain control signal received from the AGC controller and a gain multiplier configured to multiply the series of gain values to the digital signal. In another example, the digital gain compensation circuitry may include an equalizer configured to process the digital signal using filter coefficients. Different filter coefficients may be applied to the digital signal based on the digital gain control signal.

In examples, the transceiver may include a digital step attenuator configured to attenuate the received analog signal, and a gain state of the digital step attenuator may be switched based on the analog gain control signal. The transceiver may include a low noise amplifier configured to amplify the received analog signal, and a gain of the low noise amplifier may be switched based on the analog gain control signal. The transceiver may include a digital down-converter configured to down-convert the digital signal, and the digital gain compensation may be applied to the down-converted digital signal.

In examples, the ramp profile may be computed by measuring a gain step response on a continuous wave (CW) tone. A CW tone may be injected into the receiver, and the receiver down-converts the CW tone to DC. The gain state is then switched while the signal is recorded. The ramp function is the inverse of the measured transition to the gain state change. The transient response of the receiver is inverted to create the ramp profile.

Alternatively, the ramp profile may be computed by processing a transmit signal coupled onto a receive chain. A fraction of the transmit signal transmitted on the transmit chain may be coupled onto the receive chain. The gain is switched while the transmit signal coupled onto the receive chain is processed through the receive chain and recorded. This recorded waveform is then time-aligned to the transmit waveform and compared sample-by-sample to determine the ramp profile. The transmit signal may be a wideband signal.

Figure 4:
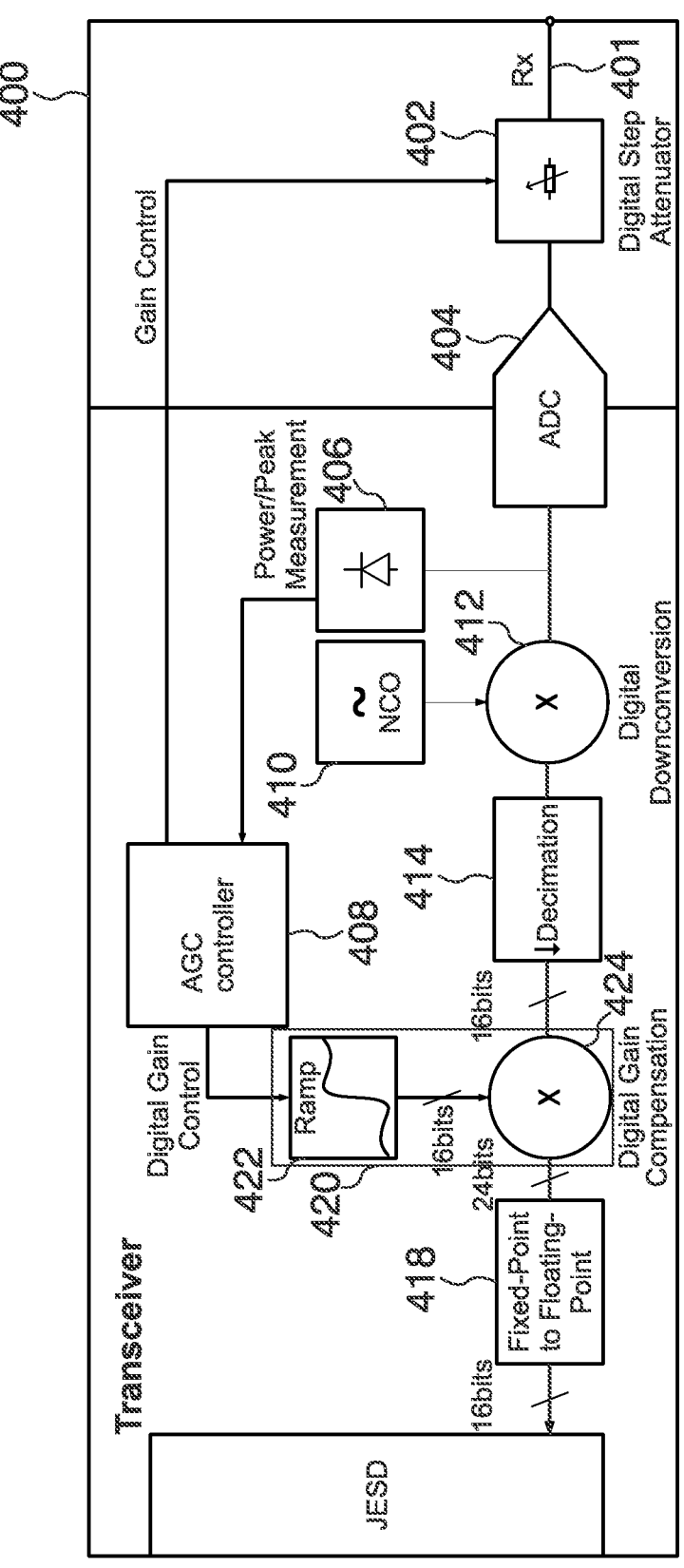
FIG. 4 is a schematic block diagram of an example transceiver including AGC and digital gain compensation in accordance with one example where a ramp profile is applied in digital gain compensation.

FIG. 4 is a schematic block diagram of an example transceiver including AGC and digital gain compensation in accordance with one example where a ramp profile is applied in digital gain compensation. Only a portion of the receive chain is shown in FIG. 4 for simplicity. The received signal (analog signal) 401 may be attenuated by a DSA 402 or an LNA (not shown). After the DSA 402, the ADC 404 may convert the received analog signal to a digital signal (digital binary bits). A measurement unit 406 measures a signal level (e.g., an average or peak value of the signal power or amplitude) on the digital signal in digital domain and sends information/indication regarding the signal level measurement to the AGC controller 408. The AGC controller 408 determines whether to adjust the gain for the received analog signal based on the signal level measurement and may send an analog gain control signal to the DSA 402 (or to the LNA (not shown)). The gain state at the DSA 402 or at the LNA may then be switched based on the analog gain control signal. The digital signal may be down-converted by a digital down-converter 412 with the local oscillator signal from the NCO 410. After down-conversion, decimation (down-sampling) may be performed by the decimation circuitry 414. Digital gain compensation may be performed by the digital gain compensation block (circuitry) 420 by multiplying a complex gain to the digital signal. The AGC controller 408 ensures that the timing of the analog gain change and the corresponding digital gain compensation align. After digital gain compensation fixed-point to floating-point conversion may be performed by the converter 418.

In examples, the AGC controller 408 sends a gain control signal to the ramp profile block (circuitry) 422 and the ramp profile block 422 generates a series of complex gain values that follows a ramp function based on the gain control signal. The ramp function may be an inverse of a transient response to the gain change in analog domain. The series of complex gain values that follow the ramp function are then sent to the multiplier 424 to be multiplied with the digital signal for the digital gain compensation.

Figure 5:
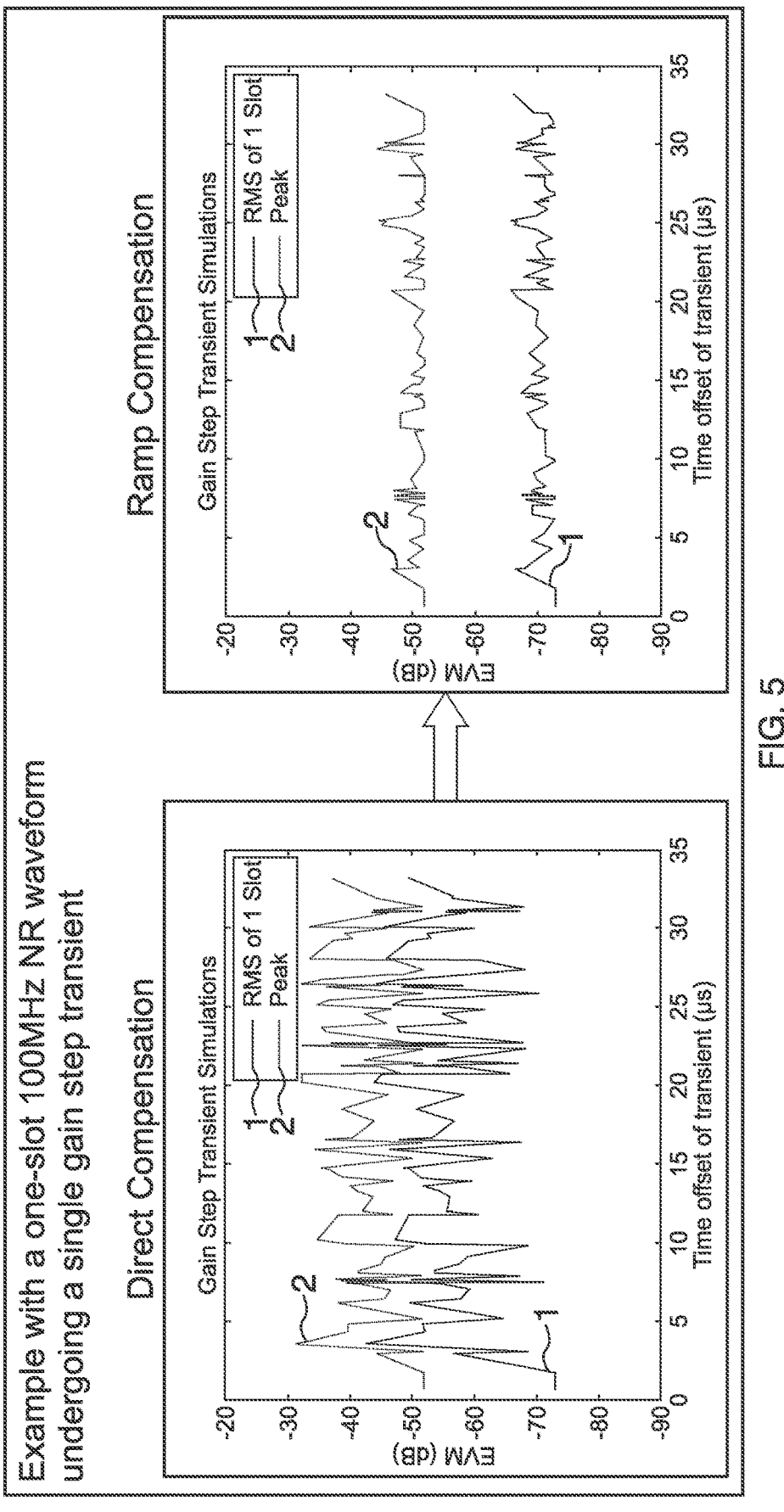
FIG. 5 shows simulations results for the performance comparison of the direct compensation and the ramp-based compensation.

FIG. 5 shows simulations results for the performance comparison of the direct compensation and the ramp-based compensation. In the simulation, a single slot transmission is interrupted by a gain state change, which is digitally compensated for. The residual error vector magnitude (EVM) error is shown in FIG. 5. The x-axis represents differences in the timing of when the gain state change occurs within the slot. FIG. 5 shows that the EVM is improved by adding ramping to the digital gain compensation. The ramping method improves the EVM performance by up to 20 dB.

The ramp profile (ramp function) may be computed by measuring the gain step response on a continuous wave (CW) tone. A CW tone may be injected into the receiver, and the receiver is used to down-convert the CW tone to DC. The gain state is then switched while the signal is recorded. The ramp function is the inverse of the measured transition to the gain state change. The transient response of the receiver is inverted to create the ramp profile.

Figure 6:
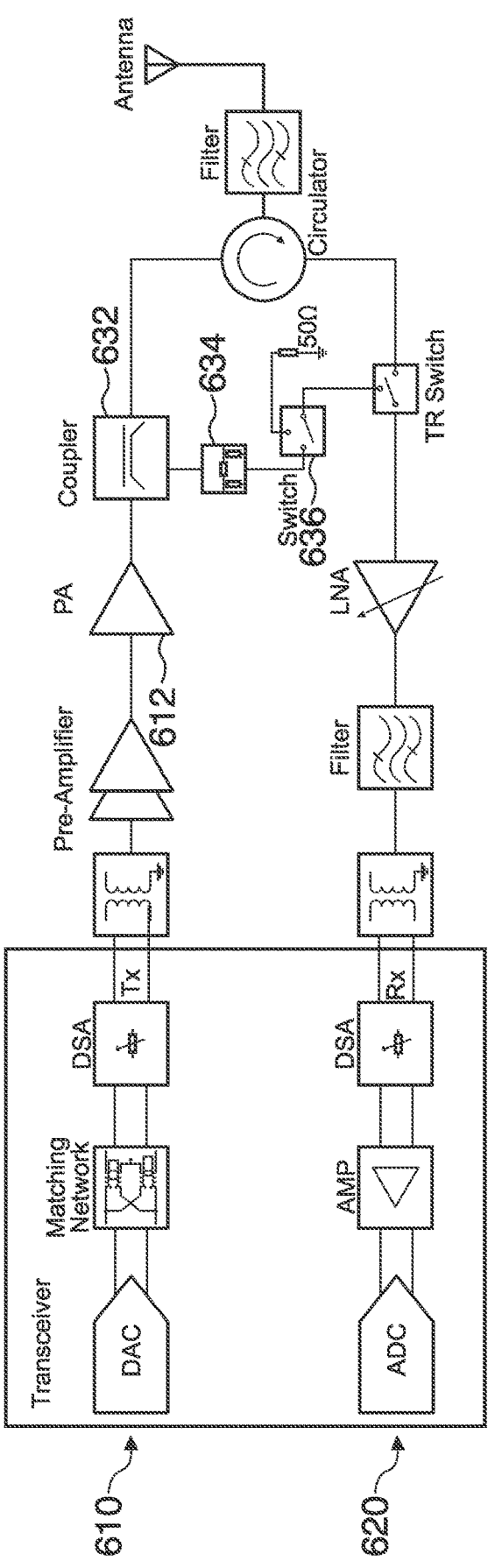
FIG. 6 shows an example for the calibration of the ramp function using the wideband waveform injected from the transmitter.

Another way of calculating or calibrating the ramp profile (ramp function) is to use a wideband waveform (e.g., a Fifth Generation (5G) New Radio (NR) waveform) coupled from the transmitter. FIG. 6 shows an example for the calibration of the ramp function using the wideband waveform injected from the transmitter. The transceiver includes a transmit chain 610 and a receive chain 620. The transmitter transmits a transmit signal (e.g., a wideband waveform) on the transmit chain 610. A fraction of the transmit signal on the transmit chain 610 (e.g., after being amplified by the power amplifier 612) is coupled onto the receive chain 620, for example via a coupler 632, an attenuator 634, and a switch 636, and processed by the receive chain 620.

The gain is switched while the transmit signal (e.g., a wideband waveform) coupled onto the receive chain 620 is processed through the receive chain 620 and recorded. This recorded waveform is then time-aligned to the transmit waveform (e.g., the reference waveform) from the transmitter and compared sample-by-sample to determine the ramp profile. This type of calibration is more effective for compensating in wideband channels. For example, in a time-division duplex (TDD) system, the full-waveform calibration may be performed during Tx operation by looping the transmit signal into the receiver. This allows a device to do periodic updates on the ramp function, for example to compensate for temperature effects, aging, or the like.

Figure 7A:
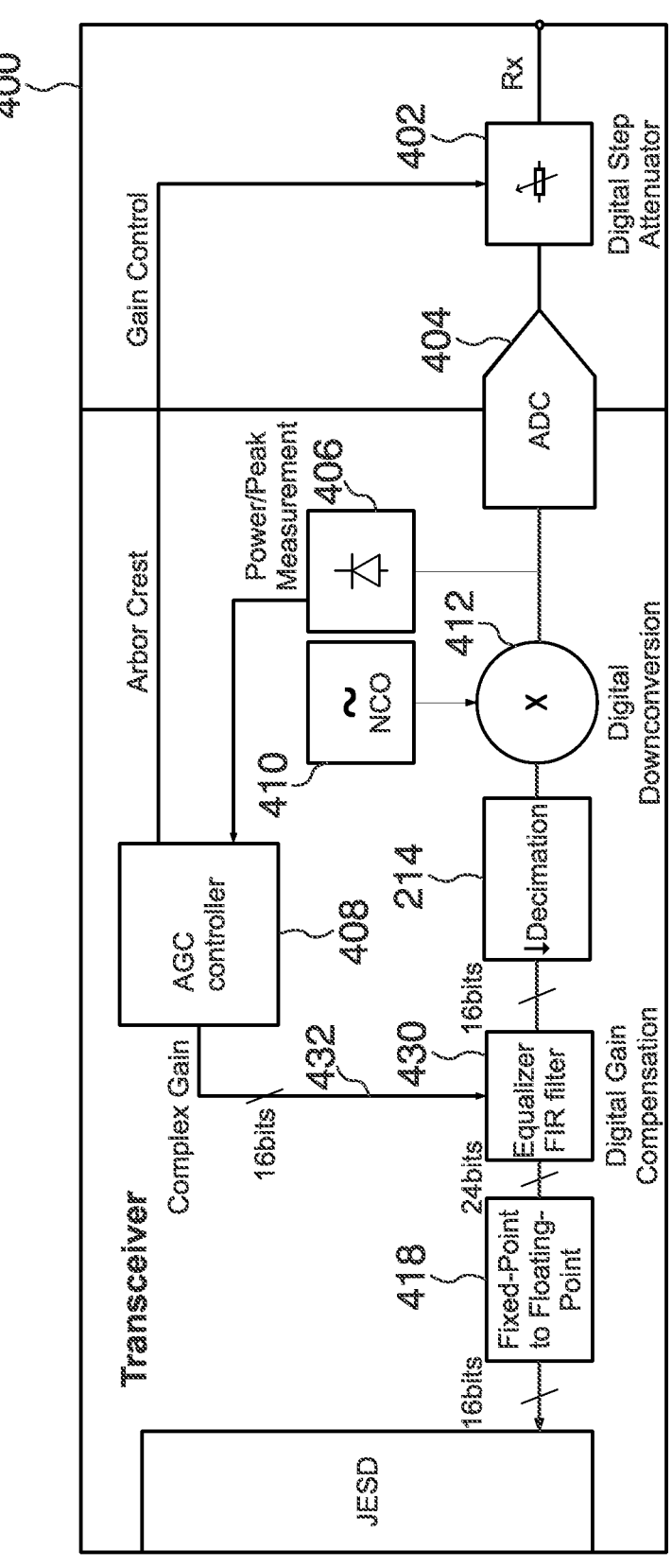
FIGS. 7A and 7B are schematic block diagrams of an example transceiver with an equalizer for digital gain compensation without and with ramp function, respectively.

For wideband channels, the frequency dependence of the channel may need to be taken into consideration when applying the digital gain compensation. In another example, an equalizer (e.g., in the form of a complex finite impulse response (FIR) filter, infinite impulse response (IIR) filter, or any other type of linear or non-linear digital filters) may be used in place of the gain multiplier 424 and the ramp block 422 in FIG. 4. FIG. 7A is a schematic block diagram of an example transceiver with an equalizer for digital gain compensation. The structure of the transceiver in FIG. 7A is same as the transceiver in FIG. 4, except that an equalizer 430 is used instead of the gain multiplier 424 and the ramp block 422 in FIG. 4. When the gain state is switched at the DSA 402 or at the LNA, the equalizer coefficients may be changed for the digital gain compensation. The equalizer 430 processes the digital bits using filter coefficients. Different filter coefficients are used for processing the digital bits based on the digital gain control signal 432 from the AGC controller 408. The AGC controller 408 determines whether to adjust the gain for the received analog signal based on the signal level measurement and send an analog gain control signal to the DSA 402 (or to the LNA (not shown)) and to the equalizer 430. The gain state at the DSA 402 or at the LNA may then be switched based on the analog gain control signal. The corresponding digital gain compensation is then performed by equalizer 430. The AGC controller 408 ensures that the timing of the analog gain change at the DSA 402 or LNA and the corresponding digital gain compensation at the equalizer 430 align.

Figure 7B:
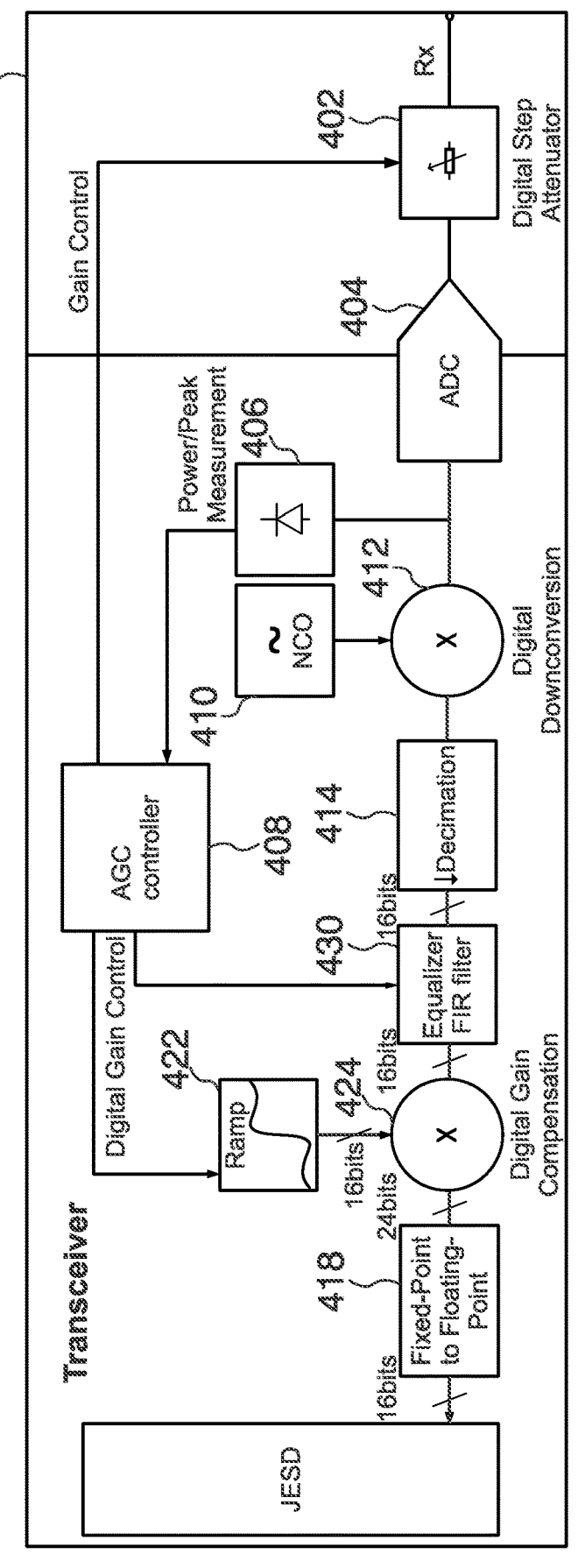

The swapping of filter coefficients in the equalizer 430 can contribute to the transient response of the gain change in the analog domain. Swapping the coefficients of the equalizer 430 causes its own transient response that can degrade the EVM. In an example, this transient response may be included in the ramp function to compensate for this transient response in addition to the analog transient response due to the gain change in the analog domain. By including the equalizer coefficients swap in the measurement of the ramp profile, the transition can be further compensated. FIG. 7B shows a schematic block diagram of an example transceiver with an equalizer for digital gain compensation block with the ramp function. In this example, an equalizer 430 is used for digital gain compensation and the ramp function (i.e., the ramp profile block 422 and the gain multiplier 424) is used for compensating the transition response due to the gain state change in analog domain and the filter coefficient swapping in the equalizer 430. The ramp profile block 422 generates a series of complex gain values that follows a ramp function based on the gain control signal from the AGC controller 430 and the gain values are multiplied to the digital bits by the multiplier 424. This compensates for the transient response due to the swapping of the coefficients at the equalizer 430 in addition to the transient response due to the gain state change at the DSA 402 or at the LNA. In this case, a wideband waveform may be used for calibration to capture the frequency dependence of the channel. Alternatively, the ramp function may be incorporated into the equalizer 430.

In examples, by using a short ramping function to compensate for the transient response of switching gain states, the degradation to the symbol can be minimized. Fast-attack AGC can be implemented without suffering degraded performance from switching gain states. Examples disclosed herein enable a digital compensation for the transient distortion.

FIG. 8 is a flow diagram of an example method for automatic gain control. An analog signal is received and the received analog signal is converted to digital signal (802). A signal level (e.g., an average or peak value of signal power or amplitude) is measured on the digital signal (804). Based on the measured signal level, an analog gain control signal is generated to change a gain to be applied to a received analog signal in analog domain and a digital gain control signal is generated for digital gain compensation corresponding to the gain change in analog domain (806). The digital gain compensation is applied based on the digital gain control signal, wherein a digital compensation gain applied to the digital signal follows a ramp profile that is an inverse of a transient response to the gain change in analog domain (808).

The digital gain compensation may be applied by generating a series of gain values following the ramp profile based on the digital gain control signal and multiplying the series of gain values to the digital signal. Alternatively, the digital gain compensation may be applied by processing the digital signal by an equalizer using filter coefficients. Different filter coefficients may be applied to the digital signal based on the gain state.

The method may include switching a gain state of a digital step attenuator based on the analog gain control signal. The method may include switching a gain of a low noise amplifier based on the analog gain control signal. The method may include down-converting the digital signal and applying the digital gain compensation to the down-converted digital signal.

The method may include measuring a gain step response on a continuous wave tone and computing the ramp profile based on the measured gain step response. Alternatively, the ramp profile may be computed by processing a transmit signal coupled onto a receive chain. The transmit signal may be a wideband signal.

Figure 9:
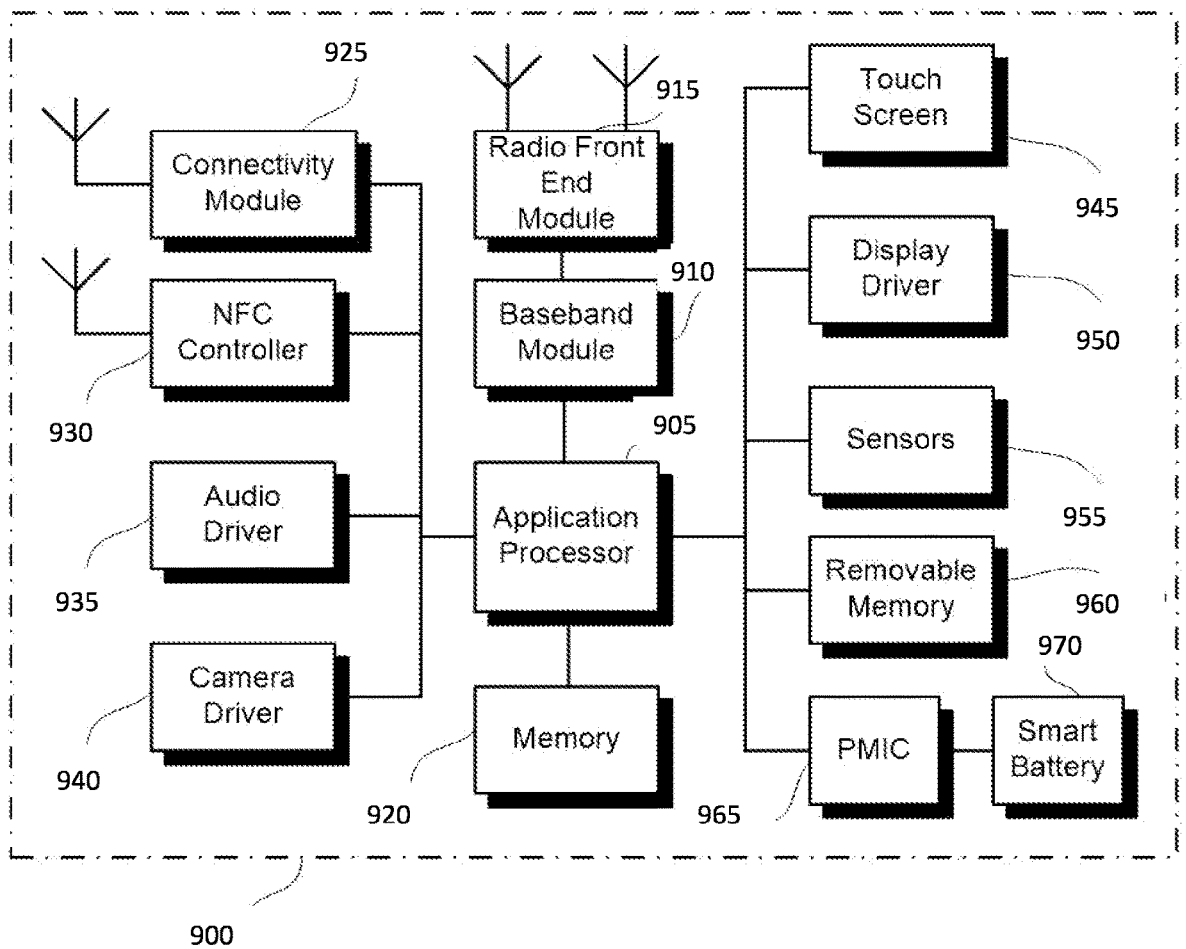
FIG. 9 illustrates a user device in which the examples disclosed herein may be implemented.

FIG. 9 illustrates a user device 900 in which the examples disclosed herein may be implemented. For example, the examples disclosed herein may be implemented in the radio front-end module 915, in the baseband module 910, etc. The user device 900 may be a mobile device in some aspects and includes an application processor 905, baseband processor 910 (also referred to as a baseband module), radio front end module (RFEM) 915, memory 920, connectivity module 925, near field communication (NFC) controller 930, audio driver 935, camera driver 940, touch screen 945, display driver 950, sensors 955, removable memory 960, power management integrated circuit (PMIC) 965 and smart battery 970.

In some aspects, application processor 905 may include, for example, one or more CPU cores and one or more of cache memory, low drop-out voltage regulators (LDOs), interrupt controllers, serial interfaces such as serial peripheral interface (SPI), inter-integrated circuit (I2C) or universal programmable serial interface module, real time clock (RTC), timer-counters including interval and watchdog timers, general purpose input-output (IO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 910 may be implemented, for example, as a solder-down substrate including one or more integrated circuits, a single packaged integrated circuit soldered to a main circuit board, and/or a multi-chip module containing two or more integrated circuits.

Figure 10:
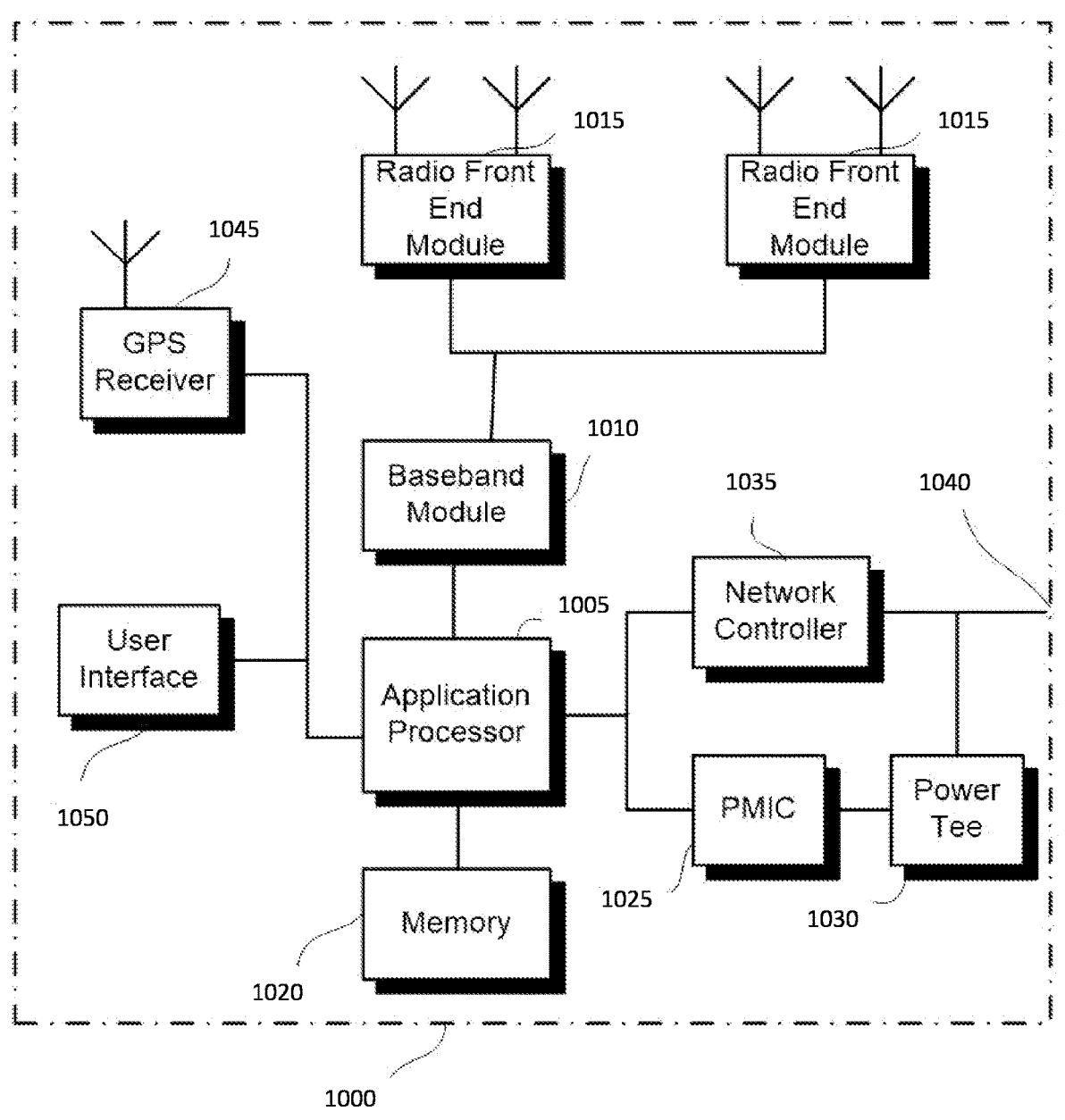
FIG. 10 illustrates a base station or infrastructure equipment radio head in which the examples disclosed herein may be implemented.

FIG. 10 illustrates a base station or infrastructure equipment radio head 1000 in which the examples disclosed herein may be implemented. For example, the examples disclosed herein may be implemented in the radio front-end module 1015, in the baseband module 1010, etc. The base station radio head 1000 may include one or more of application processor 1005, baseband modules 1010, one or more radio front end modules 1015, memory 1020, power management circuitry 1025, power tee circuitry 1030, network controller 1035, network interface connector 1040, satellite navigation receiver module 1045, and user interface 1050.

In some aspects, application processor 1005 may include one or more CPU cores and one or more of cache memory, low drop-out voltage regulators (LDOs), interrupt controllers, serial interfaces such as SPI, I2C or universal programmable serial interface module, real time clock (RTC), timer-counters including interval and watchdog timers, general purpose IO, memory card controllers such as SD/MMC or similar, USB interfaces, MIPI interfaces and Joint Test Access Group (JTAG) test access ports.

In some aspects, baseband processor 1010 may be implemented, for example, as a solder-down substrate including one or more integrated circuits, a single packaged integrated circuit soldered to a main circuit board or a multi-chip module containing two or more integrated circuits.

In some aspects, memory 1020 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magneto resistive random access memory (MRAM) and/or a three-dimensional crosspoint memory. Memory 1020 may be implemented as one or more of solder down packaged integrated circuits, socketed memory modules and plug-in memory cards.

In some aspects, power management integrated circuitry 1025 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 1030 may provide for electrical power drawn from a network cable to provide both power supply and data connectivity to the base station radio head 1000 using a single cable.

In some aspects, network controller 1035 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 1045 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 1045 may provide data to application processor 1005 which may include one or more of position data or time data. Application processor 1005 may use time data to synchronize operations with other radio base stations.

In some aspects, user interface 1050 may include one or more of physical or virtual buttons, such as a reset button, one or more indicators such as light emitting diodes (LEDs) and a display screen.

Another example is a computer program having a program code for performing at least one of the methods described herein, when the computer program is executed on a computer, a processor, or a programmable hardware component. Another example is a machine-readable storage including machine readable instructions, when executed, to implement a method or realize an apparatus as described herein. A further example is a machine-readable medium including code, when executed, to cause a machine to perform any of the methods described herein.

The examples as described herein may be summarized as follows:

An example (e.g., example 1) relates to a transceiver. The transceiver includes an ADC configured to convert a received analog signal to a digital signal, a measurement circuitry configured to measure a signal level on the digital signal, an AGC controller configured to generate, based on the measured signal level, an analog gain control signal to change a gain to be applied to a received analog signal in analog domain and a digital gain control signal for digital gain compensation corresponding to the gain change in analog domain, and a digital gain compensation circuitry configured to apply the digital gain compensation to the digital signal based on the digital gain control signal. A digital compensation gain applied to the digital signal follows a ramp profile that is an inverse of a transient response to the gain change in analog domain.

Another example (e.g., example 2) relates to a previously described example (e.g., example 1), wherein the digital gain compensation circuitry comprises a ramp circuitry configured to output a series of gain values following the ramp profile based on the digital gain control signal received from the AGC controller and a gain multiplier configured to multiply the series of gain values to the digital signal.

Another example (e.g., example 3) relates to a previously described example (e.g., example 2), wherein the digital gain compensation circuitry further comprises an equalizer configured to process the digital signal using filter coefficients. Different filter coefficients are applied to the digital signal based on the digital gain control signal, and the gain multiplier is configured to multiply the series of gain values to an output of the equalizer.

Another example (e.g., example 4) relates to a previously described example (e.g., any one of examples 1-3), further comprising a digital step attenuator configured to attenuate the received analog signal, wherein a gain state of the digital step attenuator is switched based on the analog gain control signal.

Another example (e.g., example 5) relates to a previously described example (e.g., any one of examples 1-4), further comprising a low noise amplifier configured to amplify the received analog signal, wherein a gain of the low noise amplifier is switched based on the analog gain control signal.

Another example (e.g., example 6) relates to a previously described example (e.g., any one of examples 1-5), further comprising a digital down-converter configured to down-convert the digital signal, wherein the digital gain compensation is applied to the down-converted digital signal.

Another example (e.g., example 7) relates to a previously described example (e.g., any one of examples 1-6), wherein the ramp profile is computed by measuring a gain step response on a continuous wave tone.

Another example (e.g., example 8) relates to a previously described example (e.g., any one of examples 1-7), wherein the ramp profile is computed by processing a transmit signal coupled onto a receive chain.

Another example (e.g., example 9) relates to a previously described example (e.g., any one of examples 1-8), wherein the transmit signal is a wideband signal.

Another example (e.g., example 10) relates to a method for automatic gain control. The method includes receiving an analog signal, converting the received analog signal to digital signal, measuring a signal level on the digital signal, generating, based on the measured signal level, an analog gain control signal to change a gain to be applied to a received analog signal in analog domain and a digital gain control signal for digital gain compensation corresponding to the gain change in analog domain, and applying the digital gain compensation based on the digital gain control signal. A digital compensation gain applied to the digital signal follows a ramp profile that is an inverse of a transient response to the gain change in analog domain.

Another example (e.g., example 11) relates to a previously described example (e.g., example 10), wherein the digital gain compensation is applied by generating a series of gain values following the ramp profile based on the digital gain control signal, and multiplying the series of gain values to the digital signal.

Another example (e.g., example 12) relates to a previously described example (e.g., example 11), further comprising processing the digital signal by an equalizer using filter coefficients, wherein different filter coefficients are applied to the digital signal based on the digital gain control signal, wherein the series of gain values are multiplied to an output of the equalizer.

Another example (e.g., example 13) relates to a previously described example (e.g., any one of examples 10-12), further comprising switching a gain state of a digital step attenuator based on the analog gain control signal.

Another example (e.g., example 14) relates to a previously described example (e.g., any one of examples 10-13), further comprising switching a gain of a low noise amplifier based on the analog gain control signal.

Another example (e.g., example 15) relates to a previously described example (e.g., any one of examples 10-14), further comprising down-converting the digital signal, wherein the digital gain compensation is applied to the down-converted digital signal.

Another example (e.g., example 16) relates to a previously described example (e.g., any one of examples 10-15), further comprising measuring a gain step response on a continuous wave tone, and computing the ramp profile based on the measured gain step response.

Another example (e.g., example 17) relates to a previously described example (e.g., any one of examples 10-16), wherein the ramp profile is computed by processing a transmit signal coupled onto a receive chain.

Another example (e.g., example 18) relates to a previously described example (e.g., example 17), wherein the transmit signal is a wideband signal.

Another example (e.g., example 19) relates to a machine-readable storage including machine readable instructions, when executed, to implement a method as in any one of examples 10-18.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

The invention claimed is:

1. A transceiver, comprising:

an analog-to-digital converter (ADC) configured to convert a received analog signal to a digital signal;

a measurement circuitry configured to measure a signal level on the digital signal;

an automatic gain control (AGC) controller configured to generate, based on the measured signal level, an analog gain control signal to change a gain to be applied to the received analog signal in analog domain and a digital gain control signal for digital gain compensation corresponding to the gain change; and a digital gain compensation circuitry configured to apply the digital gain compensation to the digital signal based on the digital gain control signal, wherein the digital gain compensation applied to the digital signal follows a ramp profile that is an inverse of a transient response to the gain change.

2. The transceiver of claim 1, wherein the digital gain compensation circuitry comprises:

a ramp circuitry configured to output a series of gain values following the ramp profile based on the digital gain control signal received from the AGC controller; and a gain multiplier configured to multiply the series of gain values to the digital signal.

3. The transceiver of claim 2, wherein the digital gain compensation circuitry further comprises an equalizer configured to process the digital signal using filter coefficients, wherein different filter coefficients are applied to the digital signal based on the digital gain control signal, and the gain multiplier is configured to multiply the series of gain values to an output of the equalizer.

4. The transceiver of claim 1, further comprising a digital step attenuator configured to attenuate the received analog signal, wherein a gain state of the digital step attenuator is switched based on the analog gain control signal.

5. The transceiver of claim 1, further comprising a low noise amplifier configured to amplify the received analog signal, wherein a gain of the low noise amplifier is switched based on the analog gain control signal.

6. The transceiver of claim 1, further comprising a digital down-converter configured to down-convert the digital signal, wherein the digital gain compensation is applied to the down-converted digital signal.

7. The transceiver of claim 1, wherein the ramp profile is computed by measuring a gain step response on a continuous wave tone.

8. The transceiver of claim 1, wherein the ramp profile is computed by processing a transmit signal coupled onto a receive chain.

9. The transceiver of claim 8, wherein the transmit signal is a wideband signal.

10. A method for automatic gain control, comprising:
receiving an analog signal;
converting the received analog signal to a digital signal;
measuring a signal level on the digital signal;
generating, based on the measured signal level, an analog gain control signal to change a gain to be applied to the received analog signal in analog domain and a digital gain control signal for digital gain compensation corresponding to the gain change; and
applying the digital gain compensation based on the digital gain control signal, wherein the digital gain compensation applied to the digital signal follows a ramp profile that is an inverse of a transient response to the gain change.

11. The method of claim 10, wherein the digital gain compensation is applied by:
generating a series of gain values following the ramp profile based on the digital gain control signal; and
multiplying the series of gain values to the digital signal.

12. The method of claim 11, further comprising:
processing the digital signal by an equalizer using filter coefficients, wherein different filter coefficients are applied to the digital signal based on the digital gain control signal,
wherein the series of gain values are multiplied to an output of the equalizer.

13. The method of claim 10, further comprising switching a gain state of a digital step attenuator based on the analog gain control signal.

14. The method of claim 10, further comprising switching a gain of a low noise amplifier based on the analog gain control signal.

15. The method of claim 10, further comprising down-converting the digital signal, wherein the digital gain compensation is applied to the down-converted digital signal.

16. The method of claim 10, further comprising
measuring a gain step response on a continuous wave tone; and
computing the ramp profile based on the measured gain step response.

17. The method of claim 10, wherein the ramp profile is computed by processing a transmit signal coupled onto a receive chain.

18. The method of claim 17, wherein the transmit signal is a wideband signal.

19. A non-transitory machine-readable storage including machine readable instructions, when executed by a processor, cause the processor to implement the method of claim 10.

* * * * *